Nov. 18, 1958 L. A. BAIN, JR., ET AL 2,861,029

METHODS OF MAKING PRINTED WIRING CIRCUITS

Filed Dec. 14, 1955

INVENTORS
L. A. BAIN, JR.
R. A. GESHNER
BY J. R. Hall
ATTORNEY 2,861,029

METHODS OF MAKING PRINTED WIRING CIRCUITS

Lewis A. Bain, Jr., Hinsdale, Ill., and Robert A. Geshner, Rochester, N. Y., assignors to Western Electric Company, Incorporated, New York, N. Y., a corporation of New York Application December 14, 1955, Serial No. 553,128
1 Claim. (Cl. 204—15)

This invention relates to methods of making printed wiring circuits, and more particularly to etched-foil methods of making such printed circuits.

An object of the invention is to provide new and improved methods of making printed wiring circuits having conductive strips on opposite faces of insulating boards.

Another object of the invention is to provide new and improved methods of making printed wiring boards from copper foil and phenol-fiber boards.

A further object of the invention is to provide methods of making printed wiring boards in which all portions of the wiring patterns are firmly adhered to the boards.

In the method of making printed circuits illustrating certain features of the invention, sheets of copper are placed on opposite sides of an uncured buildup of phenol-fiber, the sheets of copper are pressed tightly against the phenol-fiber, which is compressed into a board which is cured to bond the copper to the phenol-fiber board. The boards are offset printed with resist to leave only the terminal portions exposed, etching powder is applied to the resist and baked, and the terminal portions are gold-plated. Then the rest of the resist is dissolved from the copper sheets in an acid bath, the sheets are printed by offset printing with a resist to form a predetermined pattern on the sheets, etching powder is applied to the resist and baked, and the uncovered portions of the copper sheets are etched away, after which the resist is removed and the boards are coated with a protective lacquer.

A complete understanding of the invention may be obtained from the following detailed description of a method forming one embodiment of the invention when read in conjunction with the appended drawings, in which.

Figure 1:
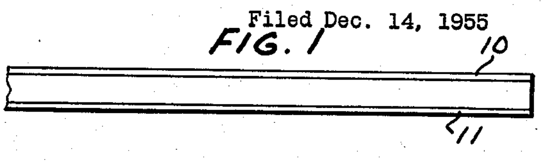
Fig. 1 is an elevation of a printed wiring panel at one step of the method.
Figure 2:
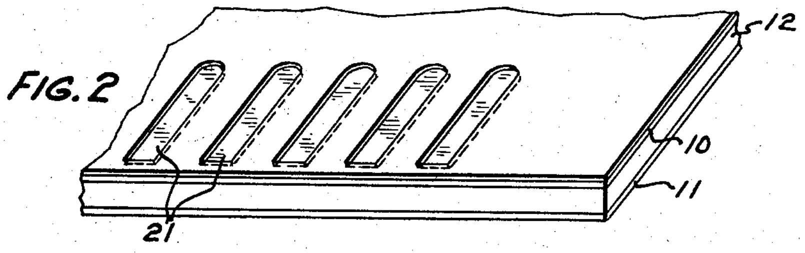
Figs. 2, 3, 4 and 5 are fragmentary perspective views of the printed wiring panel at subsequent steps of the method.
Figure 3:
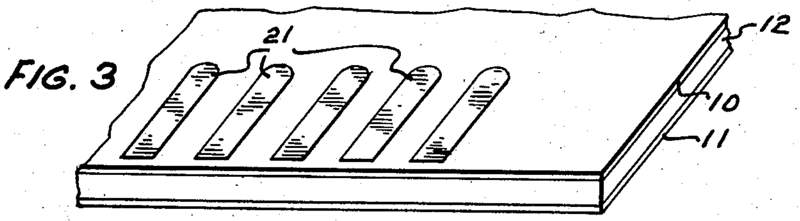
Figures 4, 5, 6:
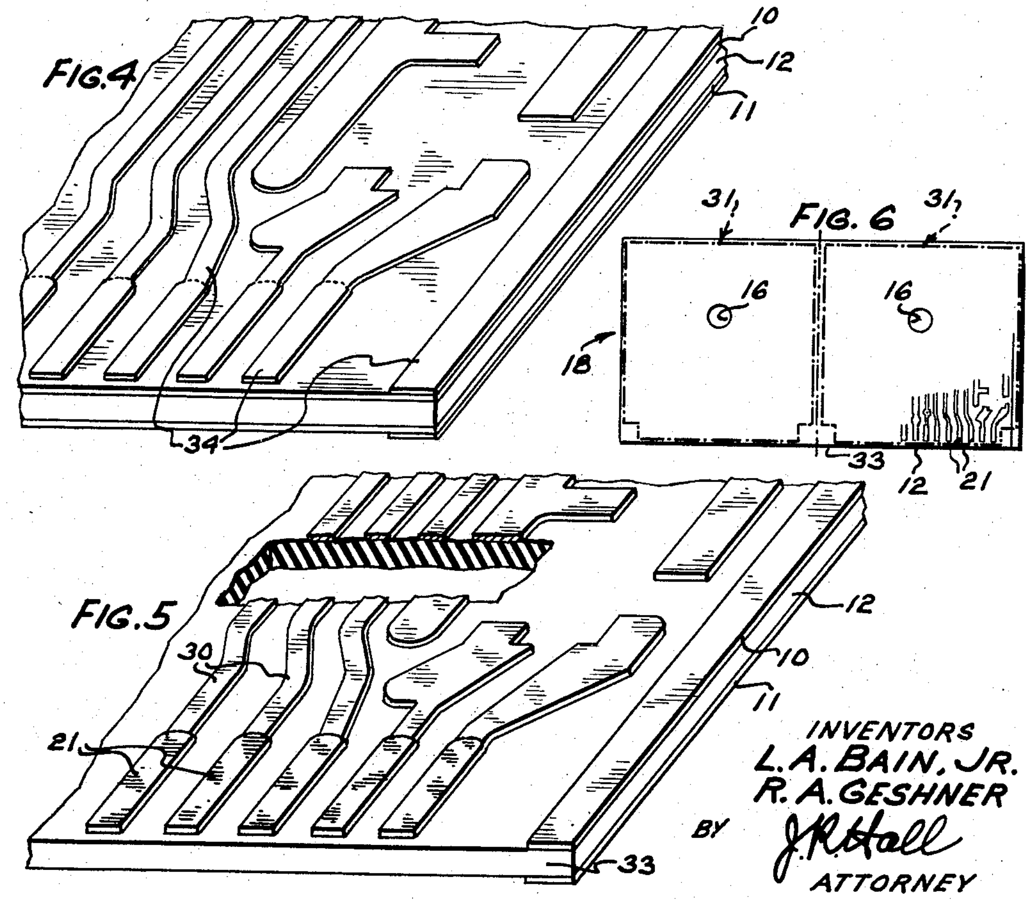
Fig. 6 is a top plan view of the board.

Referring now in detail to the drawings, thin sheets 10 and 11 of copper, or other suitable electroconductive material, with an uncured adhesive, such as, for example, a well known polyvinyl-butyral-phenolic-type adhesive, on one face of each, are placed with the adhesive-covered faces innermost on a sheet 12 of electrical insulating material, such as, for example, phenol-fiber, which, in the present instance is XXXP type phenol fiber and is in an uncured condition. One excellent adhesive is Permacel's P–195 adhesive. Then the copper sheets 10 and 11 are pressed tightly against the sheet 12 by platens of any suitable press (not shown). The sheets 10, 11 and 12 are subjected to heat while under pressure and the insulating sheet 12 is cured, which bonds the copper sheets or foils 10 and 11 closely to the opposite surfaces of the sheet 12. The composite structure then is removed from the platens and holes 16 are bored into and through the composite structure. The holes 16 are used as pilot or locating holes during processing and as holes for receiving electrical components, such as, vacuum tubes, or the like, in the final product. The structure then is sawed into panels 18 each of a multi-board size, and the panels so formed have their edges sanded to deburr them.

The panels 18 then are oriented in an offset printing press by locating pins of the press entering the holes 16, or separate mounting holes, if desired, and a coating of resist which is a well known electrical insulating, gold-cyanide resistant composition suitable for masking during electroplating, is printed on the upper face of the panel to leave bare only portions 21 to form terminals in the finished boards. A highly satisfactory resist is composed of approximately 70% phenolic resin, 2% carbon black, 1% rosin oil, and 27% tung oil. The panels then are dusted with a resinous-type etching powder of a well known type, such as, for example, powdered asphaltum or powdered resin or a combination of the two. The panels are then baked one and one-half hours at 150° F. to affix the resist and etching powder thereon. The etching powder does not actually serve to etch, but is really a resist in that it softens under heat to complement the resist by covering up pin holes and thin spots in the resist. Then the other side of the board is similarly covered with the resist to leave bare only terminals directly opposite to the terminals 21. Then the latter side is dusted with etching powder and is baked to fix the resist and etching powder on the bottom side of the panel. Then the panel is checked for full intended ink coverage, and any omissions of coverage are touched up with an electrically insulating asphalt varnish of a well known type, which is air dried. The panel is then placed in a gold-plating bath, which may be a gold-cyanide plating solution, and gold is electroplated on the terminals 21 and the terminals opposite thereto.

The panels then are placed in a chlorinated hydrocarbon solvent of a well known type, such as methylene chloride, which dissolves the asphalt resin resist and the ink resist.

The panels are placed in an offset printing press (not shown) of a well known type and located in the press by locating pins of the press entering the holes 16 or separate locating holes, if desired. The press prints positive representations of wiring patterns 30 on the upper side of the panel with the resist ink, this pattern having portions 34 covering wiring patterns 30 and the terminals 21 on the upper face of sheet 10. Then the panel is removed and dusted with the resinous-type etching powder after which it is baked for one and one-half hours at 150° F. to fix the powder and the ink. Then the bottom sheet 11 is printed to cover the terminals, apparatus designations and indicia in a printing press with the resist or ink and dusted with the etching powder and the newly printed pattern is baked one and one-half hours at 150° F. Both printed patterns then are checked for full coverage, and any omissions are touched up with the asphalt varnish and the varnish is air dried.

The panels now are ready for etching and are immersed for approximately twenty minutes in a 40° Baumé ferric chloride solution of a well known type which removes all the copper of the foils or sheets 10 and 11 except those portions thereof covered by the resist. The panels are removed from the etching solution, rinsed in water, neutralized in a sodium bicarbonate solution, and again rinsed in water. Then the panel is placed in the solvent, after which it is rinsed in water. Then the panel is scoured with steel wool and a suspension of pumice on both sides to clean it completely, and is rinsed in water, after which the panel is dipped in a protective water-dip lacquer and is air dried. The panels then are sawed into two equal pieces to roughly slightly over board size, and are heated to approximately 200° F., after which individual boards 31 are punched from the central portions of the panel halves, the heating permitting the phenol-fiber to be punched without cracking. The punching operation trims all edge portions off the boards, which edge portions, including the peripheries of the holes 16, often are contaminated with the solutions in which the panel was previously dipped. Also, such edge portions trimmed away often have the portions of the copper foil at the outside edges of the panel somewhat loosened from the phenol-fiber while in the gold-plating solution, the outside edge portions being exposed to attack of the adhesive by the gold-plating solution. Sufficient width at the outside edges, about one-eighth of an inch, is removed by the trimming that all the loosened foil or sheet is removed from the boards so that no peeling of the foil on the resulting boards will occur during further operations thereon and use thereof. By first gold-plating the terminal portions, which are located centrally or well inside the edges of the sheets 10 and 11, and then printing the entire wiring pattern which also is centrally located on the panel, and etching the rest of the foil away, the gold-plating solution does not have sufficient time to reach and damage the adhesive under any portion of the wiring pattern, the gold-plating solution being very destructive of the portions of adhesive that it comes in direct contact with.

The edges of the boards are milled, if necessary, to remove burrs therefrom, and an edge 33 adjacent to the terminals 21 is rounded at the corners thereof either by milling, pressing under heat and pressure or filing. A lacquer thinner is applied to each individual board to dissolve the lacquer on the terminals 21. The boards then are further perforated and assembled with electrical components thereon soldered to the printed wiring.

The above-described method produces very durable printed wiring boards economically and rapidly. Also, all the foil of the wiring pattern is bonded excellently to the phenol-fiber.

It is to be understood that the above-described arrangements are simply illustrative of the application of the principles of the invention. Numerous other arrangements may be readily devised by those skilled in the art which will embody the principles of the invention and fall within the spirit and scope thereof.

What is claimed is:

The method of making a printed wiring board having gold-plated terminal portions, comprising bonding metal foil onto one side of a phenol-fiber board with an adhesive, depositing a resist on the foil in a pattern exposing the terminal portions to be gold-plated, immersing the board in a gold-plating solution caustic to the adhesive, electroplating a layer of gold onto the exposed terminal portions, removing the board from the solution, removing the resist to expose the metal foil and the gold-plated terminal portions, depositing resist onto the metal foil to cover the gold-plated terminal portions and other portions of the foil defining a predetermined circuit pattern, etching away the metal foil not covered by the resist to leave said predetermined circuit pattern with its gold-plated terminal portions, and removing the resist from the gold-plated terminal portions and the predetermined circuit pattern.

References Cited in the file of this patent

UNITED STATES PATENTS 2,702,252 Suchoff ---------------- Feb. 15, 1955
2,702,353 Herson et al. ------------ Feb. 15, 1955
2,783,193 Nieter ------------------ Feb. 26, 1957

FOREIGN PATENTS 593,979 Great Britain ------------ Oct. 30, 1947
724,379 Great Britain ------------ Feb. 16, 1955

OTHER REFERENCES

Eisler: British Institution of Radio Engineers, vol. XIII, No. 11, November 1953 pp. 523–541.

Photocircuits Corporation Pamphlet on Printed Circuits, 1954, Glen Cove, New York.

Formica Copper Clad, The Formica Company, 4614 Spring Grove Avenue, Cincinnati 25, Ohio, 1954.